(12) United States Patent
Skow et al.

(10) Patent No.: US 11,879,944 B2
(45) Date of Patent: Jan. 23, 2024

(54) WIRELESS PROCESS VARIABLE TRANSMITTER WITH REMOVABLE POWER MODULE

(71) Applicant: Rosemount Inc., Shakopee, MN (US)

(72) Inventors: Cody James Skow, Shakopee, MN (US); Nicholas Aaron Wienhold, Waconia, MN (US); Allen Kempke, Minnaepolis, MN (US); Jared Joseph Neuharth, Prior Lake, MN (US); John Allan Kielb, Eden Prairie, MN (US)

(73) Assignee: ROSEMOUNT INC., Shakopee, MN (US)

( * ) Notice: Subject to any disclaimer, the term of this patent is extended or adjusted under 35 U.S.C. 154(b) by 0 days.

(21) Appl. No.: 17/699,518

(22) Filed: Mar. 21, 2022

(65) Prior Publication Data

US 2023/0296678 A1    Sep. 21, 2023

(51) Int. Cl.
*G01R 31/36* (2020.01)
*G08B 5/36* (2006.01)
(Continued)

(52) U.S. Cl.
CPC ........... *G01R 31/3646* (2019.01); *G08B 5/36* (2013.01); *G08B 21/182* (2013.01); *G08C 17/02* (2013.01)

(58) Field of Classification Search
CPC .... G01R 31/3646; G08B 5/36; G08B 21/182; G08C 17/02
(Continued)

(56) References Cited

U.S. PATENT DOCUMENTS 5,610,511 A * 3/1997 Parker ............... G01R 19/16542
324/435
6,483,275 B1 * 11/2002 Nebrigic ............ G01R 31/3648
324/426
(Continued)

FOREIGN PATENT DOCUMENTS

CN          1785699 A       6/2006
JP      2009-527889 A       7/2009
WO     2007/098222 A2      8/2007

OTHER PUBLICATIONS

Summons to attend Oral Proceedings from European Patent Application No. EP 10784890.5, dated Jul. 20, 2015.
(Continued)

*Primary Examiner* — Zhen Y Wu
(74) *Attorney, Agent, or Firm* — Westman, Champlin & Koehler, P.A.

(57) ABSTRACT

A wireless process variable transmitter for use in an industrial process includes a process variable sensor configured to sense a process variable of the industrial process. Measurement circuitry connected to the process variable sensor provides an output related to the sensed process variable. Wireless communication circuitry connected to the measurement circuitry wirelessly transmits information related to the sensed process variable to a remote location. A removable industrial power module is configured to hold a replaceable battery and provide power to the process variable sensor, the measurement circuitry and the wireless communication circuitry. Battery test circuitry in the removable industrial power module connects to the replaceable battery and provides a visual output related to a condition of the replaceable battery.

24 Claims, 8 Drawing Sheets

(51) Int. Cl.
*G08B 21/18* (2006.01)
*G08C 17/02* (2006.01)

(58) Field of Classification Search
USPC ...................................................... 340/539.1
See application file for complete search history.

(56) References Cited

U.S. PATENT DOCUMENTS

| | | | | |
|---|---|---|---|---|
| 6,625,552 | B1* | 9/2003 | Delvecchio | G01R 31/3646 320/132 |
| 6,680,690 | B1 | 1/2004 | Nilsson et al. | |
| 6,925,419 | B2 | 8/2005 | Duren et al. | |
| 7,042,349 | B2* | 5/2006 | Bergman | G08B 25/003 340/539.1 |
| 7,285,959 | B1 | 10/2007 | Collins et al. | |
| 8,031,453 | B2 | 10/2011 | Nelson et al. | |
| 8,346,191 | B2 | 1/2013 | Robinson et al. | |
| 8,447,367 | B2 | 5/2013 | Wenger | |
| 8,852,775 | B2 | 10/2014 | McGuire et al. | |
| 9,040,181 | B2 | 5/2015 | McGuire | |
| 9,485,649 | B2 | 11/2016 | Citrano, III et al. | |
| 9,494,656 | B2* | 11/2016 | Yao | G01R 31/367 |
| 9,520,599 | B2 | 12/2016 | McGuire | |
| 10,305,403 | B2 | 5/2019 | Lovegren et al. | |
| 2002/0148460 | A1* | 10/2002 | Hsu | F24C 3/103 126/39 R |
| 2003/0048106 | A1* | 3/2003 | Bertness | G01R 31/36 324/426 |
| 2003/0171827 | A1 | 9/2003 | Keyes, IV et al. | |
| 2004/0041703 | A1* | 3/2004 | Bergman | G08B 25/003 340/514 |
| 2004/0145371 | A1* | 7/2004 | Bertness | H02J 7/005 324/426 |
| 2005/0057256 | A1* | 3/2005 | Bertness | G01N 27/417 324/426 |
| 2005/0206346 | A1* | 9/2005 | Smith | H02J 7/0049 320/132 |
| 2005/0245291 | A1* | 11/2005 | Brown | G05B 19/4185 455/343.1 |
| 2007/0201192 | A1 | 8/2007 | McGuire et al. | |
| 2007/0285224 | A1 | 12/2007 | Karschnia et al. | |
| 2008/0106267 | A1* | 5/2008 | Bertness | G01R 31/389 324/426 |
| 2008/0274772 | A1 | 11/2008 | Nelson et al. | |
| 2008/0280568 | A1 | 11/2008 | Kielb et al. | |
| 2008/0310195 | A1 | 12/2008 | Seberger et al. | |
| 2009/0015216 | A1 | 1/2009 | Seberger et al. | |
| 2010/0123591 | A1 | 5/2010 | Bauschke et al. | |
| 2011/0171497 | A1* | 7/2011 | McGuire | H01R 33/945 429/7 |
| 2014/0061163 | A1* | 3/2014 | Deb | B65D 43/22 218/155 |
| 2014/0188413 | A1* | 7/2014 | Bourilkov | G01R 31/385 702/63 |
| 2014/0197857 | A1* | 7/2014 | Partee | G01R 1/02 324/756.07 |
| 2015/0007636 | A1* | 1/2015 | Benkert | G01N 33/0009 73/53.01 |
| 2015/0244002 | A1* | 8/2015 | McGuire | H01M 50/1535 429/61 |
| 2016/0099606 | A1* | 4/2016 | Zhang | H02J 50/10 320/108 |
| 2021/0341518 | A1* | 11/2021 | Friesen | H04Q 9/00 |
| 2022/0283230 | A1* | 9/2022 | Wigney | H01M 6/5061 |

OTHER PUBLICATIONS

Notification of Transmittal of the International Search Report and the Written Opinion from the International Searching Authority for Application No. PCT/US2010/054229, dated Feb. 16, 2011.
Office Action from Chinese patent application Serial No. 2010800134114, dated Aug. 22, 2012.
Office Action from Chinese patent application Serial No. 2010800134114, dated Apr. 1, 2013.
Office Action from Russian patent application Serial No. 2012134461.7, dated Oct. 23, 2013.
Office Action from Canadian patent application Serial No. 2,786,582, dated May 31, 2013.
Office Action from Japanese patent application Serial No. 2012-544504, dated Jan. 7, 2014.
Office Action from Russian patent application Serial No. 2012134461.7, dated Feb. 6, 2014.
Office Action from Russian patent application Serial No. 2012134461.7, dated Aug. 8, 2014.
Office Action from European patent application Serial No. 10784890.5, dated Jun. 16, 2014.
Office Action from Japanese patent application Serial No. 2012-544504, dated Nov. 11, 2014.
Office Action from U.S. Appl. No. 12/900,659, dated Oct. 27, 2014.
Office Action from U.S. Appl. No. 12/900,659, dated May 2, 2014.
Office Action from U.S. Appl. No. 12/900,659, dated Dec. 24, 2013.
Office Action from U.S. Appl. No. 12/900,659, dated Jul. 2, 2013.
Notice of Allowance from U.S. Appl. No. 14/709,797, dated Aug. 12, 2016.
Office Action from Canadian patent application Serial No. 2,786,582, dated Jul. 11, 2013.
Examination Report from Indian patent application Serial No. 4147/CHENP/2012, dated Aug. 9, 2017.
Notification of Transmittal of the International Search Report and the Written Opinion from the International Searching Authority for Application No. PCT/US2023/061074, dated Apr. 4, 2023.

* cited by examiner

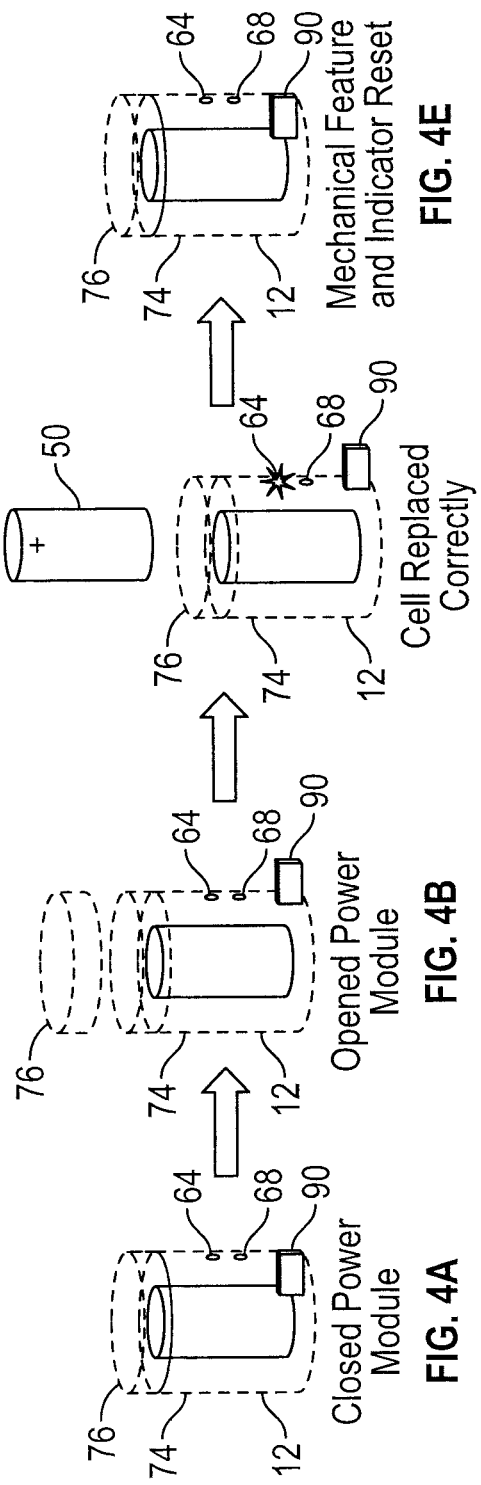

WIRELESS PROCESS VARIABLE TRANSMITTER WITH REMOVABLE POWER MODULE

BACKGROUND

In industrial settings, control systems are used to monitor and control inventories of industrial and chemical processes, and the like. Typically, the control system performs these functions using a number of field devices distributed at key locations in the industrial process. Field devices may operate in a variety of different installations. Examples of process installations include petroleum, pharmaceutical, chemical, pulp and other processing installations. These field devices are communicatively coupled to control circuitry in a control room.

Field devices are used by the process control measurement industry for a variety of purposes. Usually, such devices have a field-hardened enclosure so that they can be installed outdoors in relatively rugged environments and be able to withstand climatological extremes of temperature, humidity, vibration and mechanical shock. Field devices also typically operate on relatively low power. For example, some field devices are currently available that receive all of their operating power from a known 4-20 mA loop.

Traditionally, field devices have been coupled to the process communication system (such as a control room) by virtue of physical conductors. Such wired connections have not only provided power to the field devices, but have also provided a route for communication. One limitation with wired field devices is that installation can sometimes be labor intensive since wires must be run to each physical location of a field device.

More recently, field devices have emerged that employ wireless communication to communicate with the control room and/or other suitable devices. These wireless field devices are generally provided with an internal power source, such as a battery, that can provide operating power for the wireless field device for a period of years. Example wireless communication standards include WirelessHART® (IEC 62591) or ISA 100.11a (IEC 62734), or another wireless communication protocol, such as WiFi, LoRa, Sigfox, BLE, or any other suitable protocol including a custom communication protocol.

The use of wireless technology in the industrial process industry has created a need for a way to locally power wireless transmitters. Batteries are one way that local power can be provided. However, one problem with batteries is that they may need to be replaced.

SUMMARY

A wireless process variable transmitter for use in an industrial process includes a process variable sensor configured to sense a process variable of the industrial process. Measurement circuitry connected to the process variable sensor provides an output related to the sensed process variable. Wireless communication circuitry connected to the measurement circuitry wirelessly transmits information related to the sensed process variable to a remote location. A removable industrial power module is configured to hold a replaceable battery and provide power to the process variable sensor, the measurement circuitry and the wireless communication circuitry. Battery test circuitry in the removable industrial power module connects to the replaceable battery and provides a visual output related to a condition of the replaceable battery.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background

BRIEF DESCRIPTION OF THE DRAWINGS

FIGS. 4A-4E illustrate operation of the removable industrial power module in accordance with one example configuration.

DETAILED DESCRIPTION OF ILLUSTRATIVE EMBODIMENTS

Figure 1:
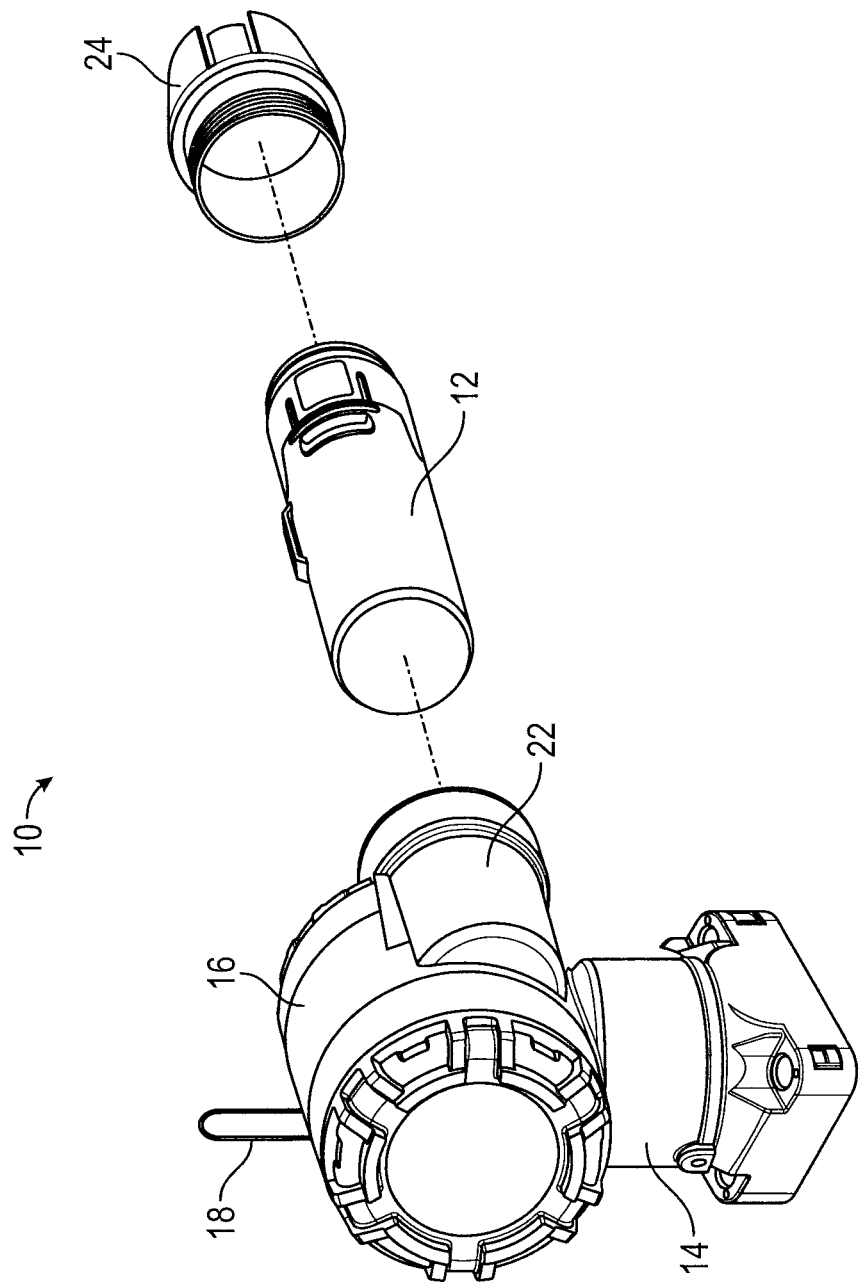
FIG. 1 is a partially exploded perspective view of a wirelessly field device including a removable industrial power module in accordance with one embodiment of the present invention.

It is desirable to allow an operator to replace a depleted battery in a removable industrial power module with an off the shelf new battery. However, there may be issues with the replacement battery and an operator may not know if the new battery that was just installed is operating correctly, if it was installed correctly, or the battery pack assembly is functioning correctly. One way of testing the battery pack is by connecting it to a hand held communicator after the power module is replaced in the field device. Additionally, an operator could wait to see if the field device is able to rejoin the wireless network. However this requires additional testing, requires the testing to be done in the field, and could result in damage to components of the field device. In various aspects, a removable battery pack is provided for a wireless process variable transmitter for use in an industrial process. The removable battery pack includes a replaceable battery along with battery test circuitry to test the replaceable battery and insure proper operation of the removable battery pack FIG. 1 is a front exploded perspective view of wireless field device (wireless process variable transmitter) 10 coupled to removable industrial power module (external battery pack) 12 in accordance with an embodiment of the present invention. Field device 10 generally includes a sensor module 14 that is mountable proximate a process installation site. One or more sensors disposed within or coupled to sensor module 14 provide electrical indications relative to the process. Examples of sensors include absolute, gage, and/or differential pressure sensors as well as temperature sensors, acoustic sensors and other suitable devices. Sensor module 14 is coupled to electronics compartment 16 which contains electronics to process or otherwise transform the electrical signals received from the one or more sensors into usable information that can be conveyed to other devices. Electronics compartment 16 generally contains communication circuitry, such as wireless communication (I/O) circuitry that communicates via antenna 18 with other devices. Communication circuitry within compartment 16, using antenna 18, can communicate with a gateway device, or other field devices disposed between field device 10 and the gateway device to interact with the gateway device. Wireless field devices are generally known, one example of a commercially-available wireless field device is under the trade designation model 3051S wireless, available from Emerson Automation Solutions of Chanhassen, Minn. Field device 10 may be one of a number of field devices disposed in a process installation in what may be termed a "mesh" network.

Some wireless field devices, such as wireless field device 10, employ an internal battery pack (removable industrial power module) that lasts for a period of years. However, when the energy of the battery pack is depleted, a technician must typically travel to the physical location of field device 10, and replace the battery pack. The new battery must be properly installed in order for the field device to function. If the replacement battery is not correctly installed or functioning properly, the wireless process variable transmitter will not function and another technician will need to be dispatched to diagnose the problem.

In accordance with an embodiment of the present invention, the batteries used to power field device 10 are located in a module (removable industrial power module 12) that is received in a module compartment 22 that is separate from electronics compartment 16. As illustrated in FIG. 1, the module compartment 22 is sealed with an end-cap 24. Examples of replaceable industrial power modules include the 701PGNKF and 701PBKKF available from Emerson Automation Solutions. These power modules are keyed in such a way that they cannot be misconnected when installed into a field device. Typically, the entire power module is replaced with a new power module. In one aspect, the invention provides a power module configured to allow an operator to replace its internal battery. However, with such a power module, it is possible for an operator to reverse the polarity of the battery/cell when placing it into the power module. When a power module with a misconnected battery/cell is installed into a field device, the field device will not operate. The reversed polarity could cause damage to field device circuitry or other equipment, could cause injury, and may violate intrinsic safety standards. Further, the new battery or the terminals of the power module could be corroded and thereby not make good electrical contact with the connectors in the power module, the operator may accidentally install a bad or otherwise depleted battery, the operator may install a battery having an incorrect voltage, or the power module may have some internal failure. In various aspects, the invention can alert the operator to these conditions.

Figure 2:
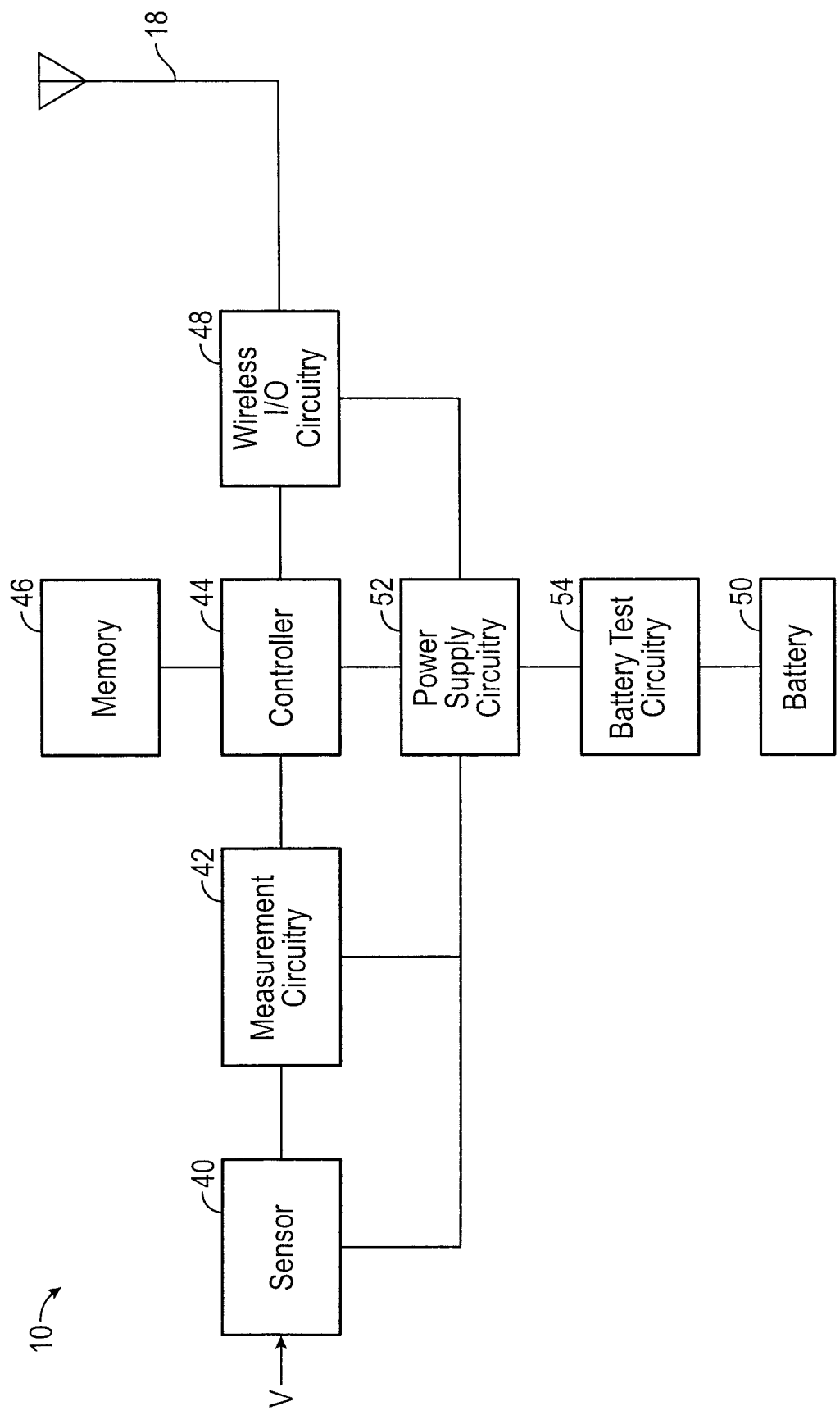
FIG. 2 is a simplified block diagram of electrical circuitry of the wireless transmitter of FIG. 1.

FIG. 2 is a simplified block diagram of process variable transmitter 10 and includes a process variable sensor 40 arranged to sense a process variable such as pressure, level, flow rate, etc. The sensor 40 provides an output to measurement circuitry 42 which, for example, may include an analog to digital converter and provides an output related to the sensed process variable to a controller 44 such as a microprocessor. Controller 44 operates in accordance with instructions stored in a memory 46 and communicates using wireless I/O communication circuitry 48 coupled to antenna 18. The controller can send information related to the sensed process variable wirelessly using antenna 18. Similarly, commands can be received from a remote location using wireless I/O circuitry 48. The controller 44 can also communicate status information such as an indication that a replaceable battery 50 should be replaced. Battery 50 connects to power supply circuitry 52 and is used to provide power to components of the process variable transmitted 10 including, for example, sensor 40, measurement circuitry 42, controller 44 and wireless I/O circuitry 48. The battery 50 is carried in the removable industrial power module 12 illustrated in FIG. 1. Battery test circuitry 54 as discussed below in more detail is also carried within module 12.

Figure 3:
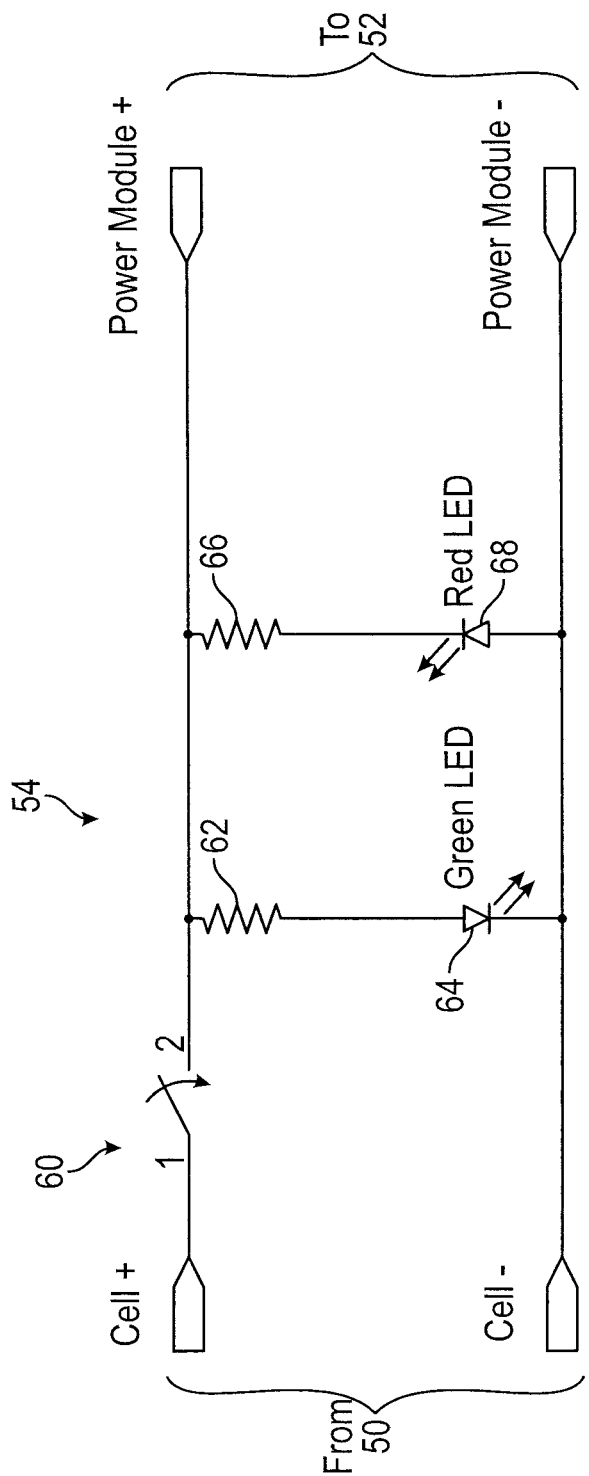
FIG. 3 is a schematic diagram of battery test circuitry of the wireless field device of FIG. 1 in accordance with one example embodiment.

FIG. 3 is a schematic diagram of one example configuration of battery test circuitry 54. Circuitry 54 is configured to couple to removable battery 50 and includes a toggle switch 60 and a first resistor in series with a green first resistor 62 coupled in series with a green LED 64. A second resistor 66 is connected in series with a red LED 68. In FIG. 3, test circuitry 54 provides a power module output which connects to power supply circuitry 52. However, the test circuitry 54 can also connect in parallel with the power supply circuitry 52.

In order to alleviate the potential of a polarity reversal or improperly installed battery, in one aspect the present invention provides battery test circuitry arranged to provide an indication that a battery is misconnected.

After a new battery is installed in the power module 12, an operator mechanically resets the toggle switch 60 to a closed position. Power from the battery 50 is then provided to power supply circuitry 52. When properly connected, the green LED 64 will be forward biased and illuminate, and the red LED 68 is reversed biased and will remain off. However, if the cell is installed with reverse polarity, the opposite will occur and the red LED 68 will illuminate.

FIGS. 4A-4E illustrate operation of one configuration of the battery module 12 including a visible reset indicator 90 which also can be used to actuate switch 60. FIG. 4A illustrates a power module in a closed position in which a power module cap 76 is sealed to a power module body 74. LEDs 64 and 68 are visible as well as reset indicator 90. In FIG. 4B, when the power module cap 76 has been removed, the reset indicator 90 extends out from the body 74 and will prevent power module 12 from being placed into module compartment 22 of wireless field device 10 illustrated in FIG. 1. FIG. 4C is an illustration of the power module 12 in which one battery 50 is inserted with an incorrect polarity. When this occurs, as discussed above, red LED 68 illuminates and indicates to an operator that the battery polarity is incorrect. In contrast, in FIG. 4D, the battery 50 is inserted in the correct direction and green LED indicator 64 illuminates. After correctly inserting the battery 50 into the module 12 and closing the cap 76, the operator can press the reset indicator 90 back into the body 74 as illustrated in FIG. 4E thereby disconnecting the LEDs 64 and 68 from the battery 50 to reduce battery drain. Further, this allows the battery module 12 to be inserted into module compartment 22 shown in FIG. 1.

FIGS. 5A-5D illustrate operation of one example of configuration of the reset indicator 90. As illustrated in FIG.

Figure 5A:
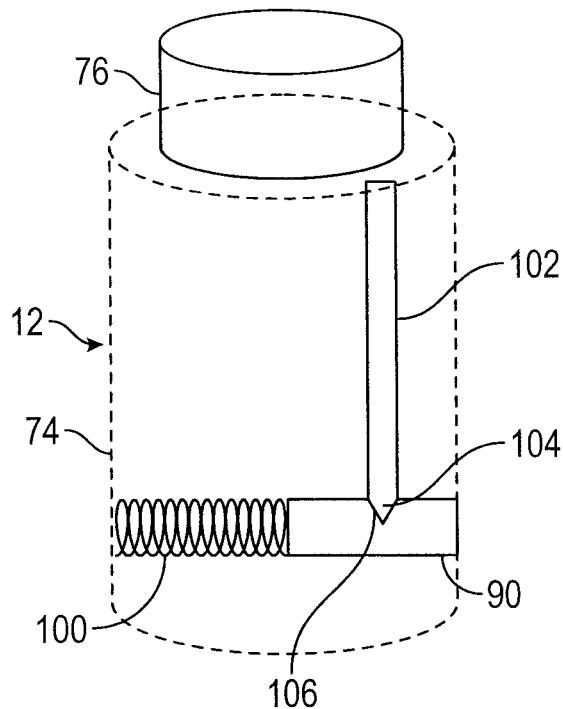
FIGS. 5A-5D illustrate operation of a mechanical reset indicator for use in the removable industrial power module.
Figure 5B:
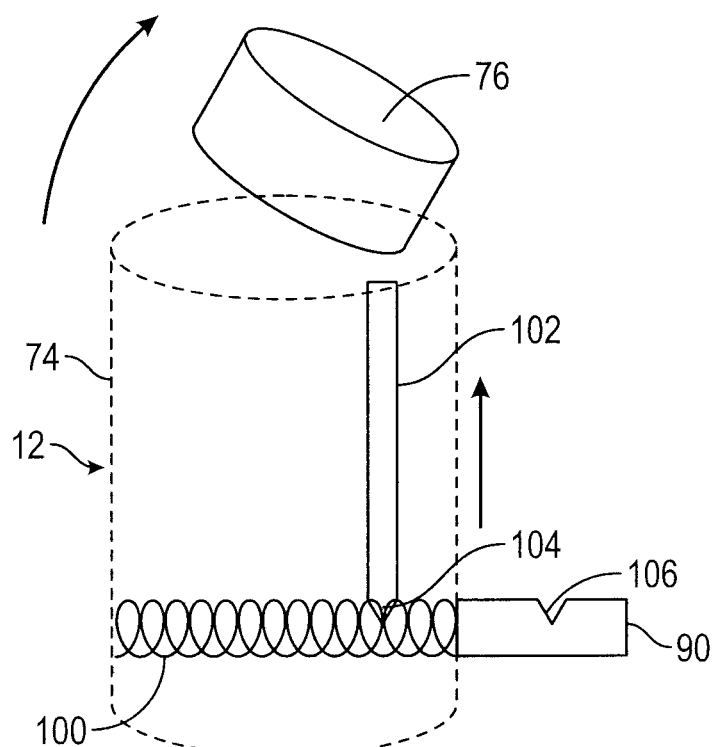
Figure 5C:
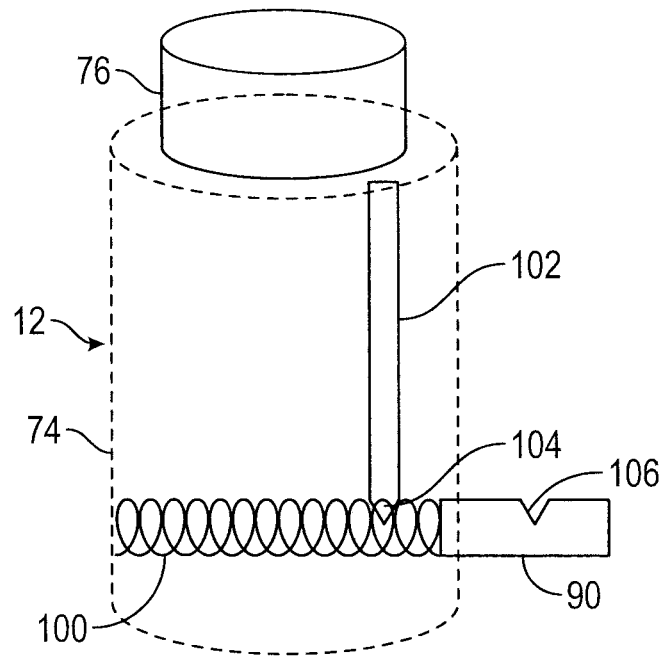
Figure 5D:
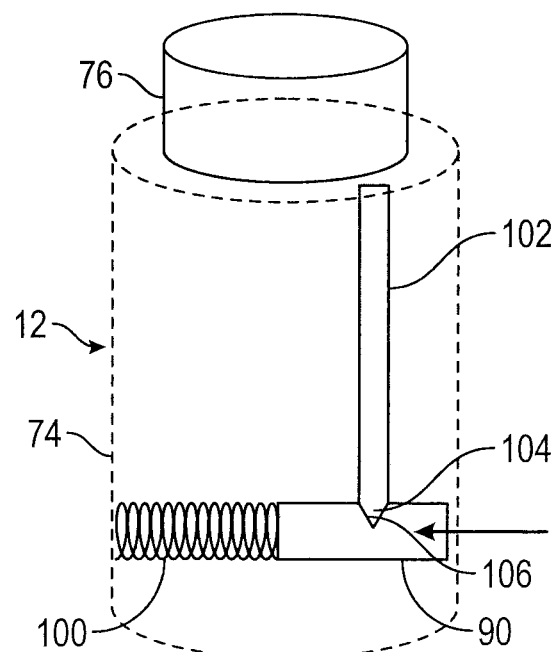

5A, with the cover 76 closed, a linkage 102 has a tip 104 which is received in a slot 106 of reset indicator 90. A spring 100 is thus maintained in a compressed condition. When the power module cap 76 is opened or otherwise removed from the body 74, the linkage 102 can move upward thereby freeing the reset indicator 90 whereby spring 100 pushes the reset indicator out of the body 74. Following battery replacement, as illustrated in FIG. 5C, the power module cap 76 can be replaced onto the body 74 and the condition of LEDs 64 and 68 viewed by an operator. Once an operator is assured that the polarity of the batteries 50 is correct, the reset indicator can be pressed inward such as illustrated in FIG. 5D and secured by the tip 104 of linkage 102. In the condition illustrated in FIG. 5D the module 12 can be placed in the module compartment 22 of the process variable transmitter 10. Additionally, the movement of the reset element 90 can be connected to switch 60 whereby LEDs 64 and 68 are disconnected from the batteries 50 when the reset indicator 90 is pressed inward as illustrated in FIG. 5D thereby preventing battery drain.

Figures 6A, 6B:
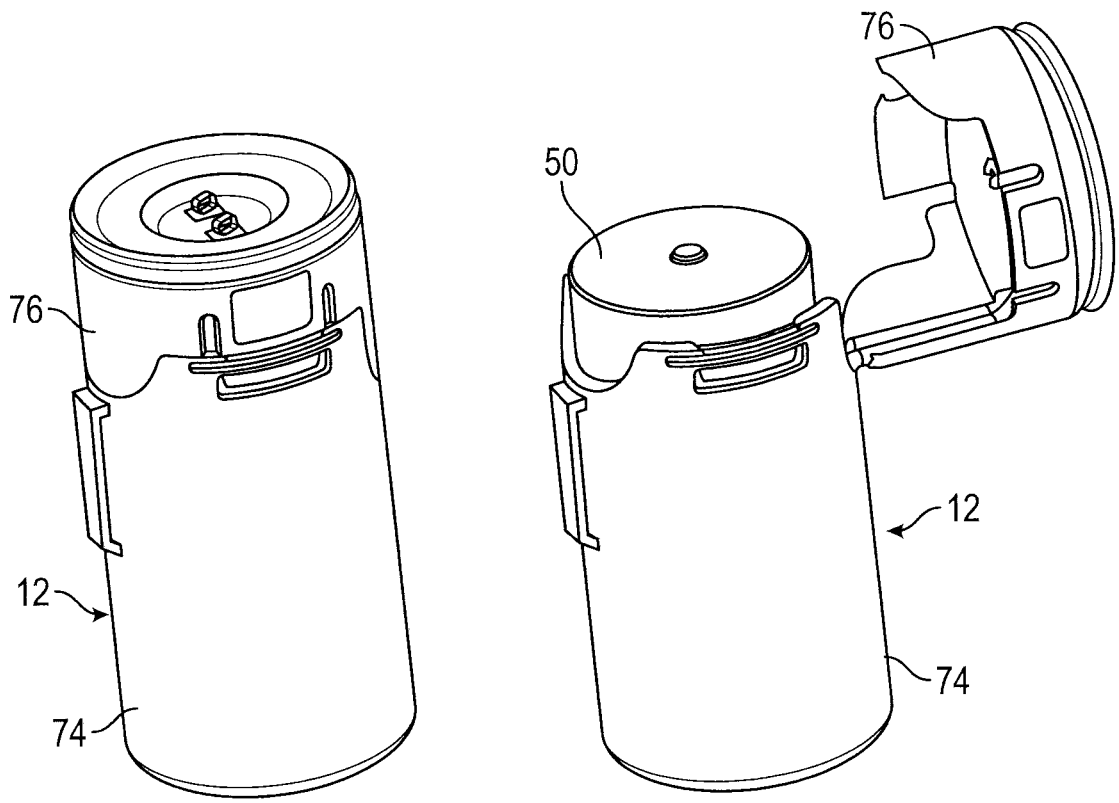
FIGS. 6A and 6B are perspective views of a removable industrial power module having a hinged cover or cap which couples to a body.

FIGS. 6A and 6B are further illustrations of an example removable industrial power module 12. FIGS. 6A and 6B are perspective views with the power module cap 76 closed or opened, respectively. In this example configuration, the power module cap 76 is hinged and secured with a latch.

Figures 7A, 7B:
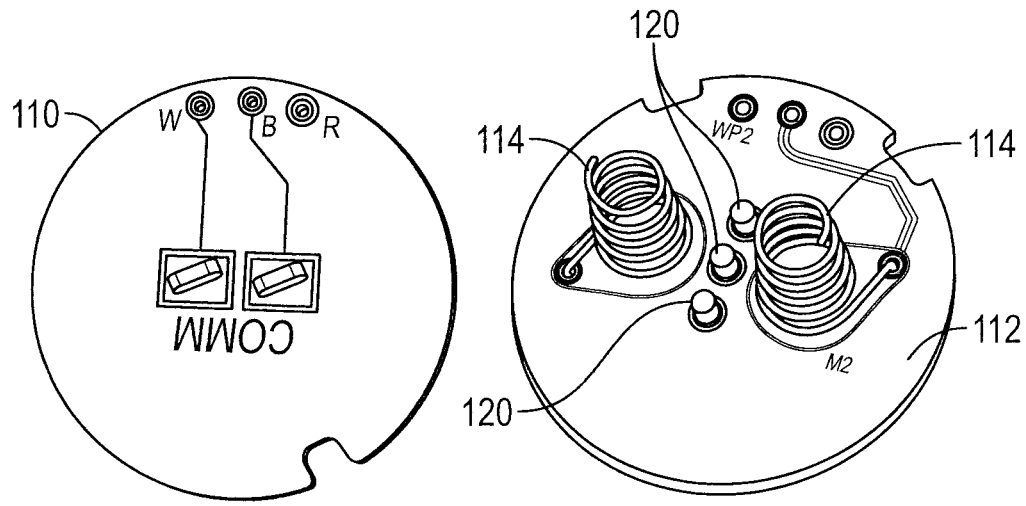
FIG. 7A is a perspective view of a top circuit board of the removable industrial power module and FIG. 7B is a perspective view of a lower or bottom circuit board of the removable industrial power module.

FIG. 7A is a perspective view of a top circuitry board 110 and FIG. 7B is a perspective view of a bottom circuit board 112 configured to fit in opposing ends of the power module 12. Connectors 120 on the lower circuit board 112 are used for providing electrical connection to the field device 10. Additionally, three wires (not shown) connect the two circuit boards together within the power module 12. The three wires provide a battery positive connection, a battery negative connection and a communication connection for communicating with a hand held diagnostic device.

As the two battery terminals are accessible on the top circuitry board 110, the top circuit board 110 can include battery test circuitry in accordance with one example embodiment. Alternatively, the battery test circuitry could be located on the lower circuit board.

Figure 8:
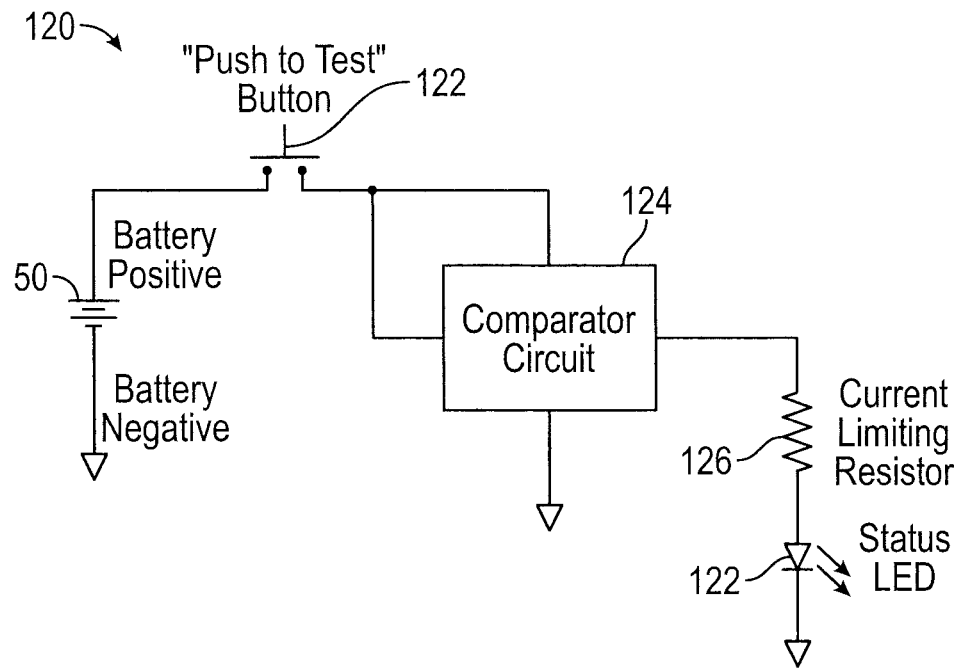
FIG. 8 is a simplified schematic diagram showing battery test circuitry in the removable industrial power module which includes a switch operated by an operator.

FIG. 8 is a schematic diagram of another example embodiment of battery test circuitry 120. In the configuration of FIG. 8, the circuitry can be carried on the top circuit board 110 as both the positive and negative battery connections are available at that location. A status LED 122 is provided which indicates whether the battery is providing a sufficient voltage output to operate the wireless field device 10. A push to test button 122 can be actuated by an operator to connect the battery 50 to a comparator circuit 124. Based upon a voltage comparison with a predetermined threshold value, an output is provided to the LED 122 through a current limiting resistor 126 to thereby indicate that the battery is "good." The comparator circuit 124 can be configured to actuate only if the battery voltage is within a predetermined voltage range. By enabling the test circuitry 120 only when the button 122 is actuated, battery current is conserved thereby ensuring that the battery is not drained. An optional second resistor (not shown) can be placed between the battery 50 and switch 122 to limit the current that can be drawn from the battery 50 for intrinsic safety purposes.

Figure 9:
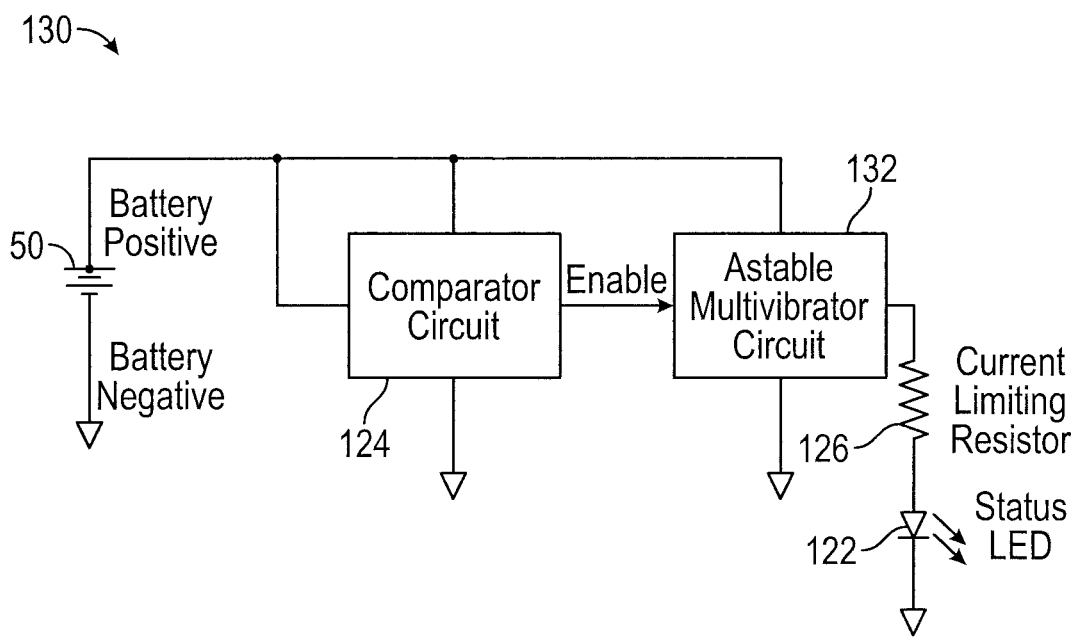
FIG. 9 is a simplified schematic diagram showing battery test circuitry in the removable industrial power module which includes an astable multi-vibrator circuit for causing a LED or other display to flash as desired.

FIG. 9 is a simplified schematic diagram of another example embodiment of battery test circuitry 120 which provides a continuous visual indication of the battery condition. In the arrangement of FIG. 9, the push button 122 of FIG. 8 is not used. Instead, an astable multi-vibrator circuit 132 is used to periodically energize the LED 122 at a very low duty cycle when enabled by the output from comparator circuit 124 such that a minimal amount of energy is consumed from the battery. The system will blink the LED 122 at a rate set by the astable multi-vibrator. The astable multi-vibrator circuit 132 can be a comparator based circuit or a transistor based circuit. The circuit 132 can be set such that it has a fixed oscillation period of approximately 5 second with an on time of approximately 40 milliseconds. The current through the LED 122 can be set to a relatively low value such as less than 2 mA. This configuration results in an equivalent DC circuit drain from the battery 50 of only 12 mA. These parameters can be adjusted as desired. An additional resistor (not shown in FIG. 9) can be placed in series with the battery 50 for purposes of limiting the current that can be drawn in accordance with intrinsic safety standards.

Although the present invention has been described with reference to preferred embodiments, workers skilled in the art will recognize that changes may be made in form and detail without departing from the spirit and scope of the invention. For example, external battery test terminals can be provided such that an operator can perform a battery test using an external voltage meter. In the configurations of FIGS. 8 and 9, additional LEDs can be provided to provide additional information such as indicating higher or lower voltage values, reverse polarity, etc.

What is claimed is:

1. A wireless process variable transmitter for use in an industrial process, comprising: a process variable sensor configured to sense a process variable of the industrial process;
   measurement circuitry connected to the process variable sensor configured to provide an output related to the sensed process variable;
   wireless communication circuitry connected to the measurement circuitry configured to wirelessly transmit information related to the sensed process variable to a remote location;
   a removable industrial power module configured to hold a replaceable battery and provide power to the measurement circuitry and the wireless communication circuitry;
   battery test circuitry located in the removable industrial power module configured to connect to the replaceable battery and provide a visual output related to a condition of the replaceable battery wherein the removable industrial power module includes a mechanical visible reset indicator which visually indicates a reset condition of the battery; and
   wherein the removable industrial power module includes a cover and the mechanical visible reset indicator is actuated by removal of the cover.

2. The wireless process variable transmitter of claim 1 including a visual indicator coupled to the battery test circuitry which provides a visual output related to the condition of the replaceable battery.

3. The wireless process variable transmitter of claim 2 wherein the visual indicator comprises a light emitting diode (LED).

4. The wireless process variable transmitter of claim 2 wherein the visual indicator is periodically actuated to reduce power consumption.

5. The wireless process variable transmitter of claim 4 including an astable multi-vibrator configured to periodically actuate the visual indicator.

6. The wireless process variable transmitter of claim 1 wherein the visual output indicates polarity of the replaceable battery in the removable industrial power module.

7. The wireless process variable transmitter of claim 1 wherein visual output is related to voltage of the replaceable battery.

8. The wireless process variable transmitter of claim 1 including a switch configured to couple the battery test circuitry to the replaceable battery.

9. The wireless process variable transmitter of claim 1 wherein the battery test circuitry compares a voltage of the replaceable battery to a threshold.

10. The wireless process variable transmitter of claim 1 wherein the mechanical visible reset indicator is spring loaded.

11. The wireless process variable transmitter of claim 1 wherein the mechanical visible reset indicator actuates a switch which selectively couples the battery test circuitry to the replaceable battery.

12. The wireless process variable transmitter of claim 1 wherein the mechanical visible reset indicator prevents placement of the removable industrial power module in a housing of the wireless process variable transmitter.

13. The wireless process variable transmitter of claim 1 wherein the removable industrial power module includes a top circuit board and a bottom circuit board.

14. The wireless process variable transmitter of claim 13 wherein the battery test circuitry is carried on at least one of the top and bottom circuit boards.

15. The wireless process variable transmitter of claim 13 wherein the top and bottom circuit boards are electrically connected.

16. The wireless process variable transmitter of claim 15 wherein an electrical connection between the top and bottom circuit boards includes a positive electrical connection, a negative electrical connection and a communication connection.

17. A removable industrial power module for use with a wireless process variable transmitter, comprising:
    electrical connectors configured to connect to the wireless process variable transmitter;
    a body configured to hold a replaceable battery and provide power to measurement circuitry and wireless communication circuitry of the wireless process variable transmitter through the electrical connectors; and
    battery test circuitry located in the removable industrial power module configured to connect to the replaceable battery and provide a visual output related to a condition of the replaceable battery wherein the removable industrial power module includes a visible reset indicator which visually indicates a reset condition of the battery and prevents placement of the removable industrial power module in a housing of the wireless process variable transmitter.

18. The removable industrial power module of claim 17 including a visual indicator coupled to the battery test circuitry which provides a visual output related to the condition of the replaceable battery.

19. The removable industrial power module of claim 18 wherein the visual indicator comprises a light emitting diode (LED).

20. The removable industrial power module of claim 18 wherein the visual indicator is periodically actuated to reduce power consumption.

21. The removable industrial power module of claim 19 including an astable multi-vibrator configured to periodically actuate the visual indicator.

22. The removable industrial power module of claim 17 wherein the mechanical visible reset indicator is spring loaded.

23. The removable industrial power module of claim 17 wherein the mechanical visible reset indicator actuates a switch which selectively couples the battery test circuitry to the replaceable battery.

24. The removable industrial power module of claim 17 wherein the removable industrial power module includes a top circuit board and a bottom circuit board and an electrical connection between the top and bottom circuit boards includes a positive electrical connection, a negative electrical connection and a communication connection.

* * * * *